United States Patent [19]
Saitoh

[11] Patent Number: 5,616,939
[45] Date of Patent: Apr. 1, 1997

[54] SEMICONDUCTOR DEVICE INCLUDING RECTANGULAR FUNCTIONAL BLOCKS HAVING AT LEAST ONE COMMON LENGTH

[75] Inventor: Sinichirou Saitoh, Kanagawa, Japan

[73] Assignee: NEC Corporation, Tokyo, Japan

[21] Appl. No.: 300,213

[22] Filed: Sep. 6, 1994

[30]    Foreign Application Priority Data

Sep. 3, 1993   [JP]   Japan ................................. 5-219385

[51] Int. Cl.$^6$ ..................................................... H01L 27/10
[52] U.S. Cl. ............................................. 257/202; 257/909
[58] Field of Search ....................................... 257/202, 909

[56]               References Cited

U.S. PATENT DOCUMENTS 4,688,070   8/1987   Shiotari et al. .......................... 257/202
5,229,629   7/1993   Koike ...................................... 257/202

FOREIGN PATENT DOCUMENTS 60-89955    5/1985   Japan ..................................... 257/909
4-109661    4/1992   Japan ..................................... 257/202
4-357864   12/1992   Japan ..................................... 257/202
6-163815    6/1994   Japan ..................................... 257/202

*Primary Examiner*—Mark V. Prenty
*Attorney, Agent, or Firm*—Whitham, Curtis, Whitham & McGinn

[57]                 ABSTRACT

In a semiconductor device having a plurality of functional blocks, the functional blocks are all rectangular, and have at least one common length along one direction.

12 Claims, 11 Drawing Sheets

5,616,939

SEMICONDUCTOR DEVICE INCLUDING RECTANGULAR FUNCTIONAL BLOCKS HAVING AT LEAST ONE COMMON LENGTH

BACKGROUND OF THE INVENTION

1. Field of the Invention

The present invention relates to a semiconductor device including a plurality of functional blocks formed on a chip.

2. Description of the Related Art

Generally, a semiconductor device, such as a signal-chip microcomputer, includes a main functional block having a central processing unit (CPU) core, and other sub functional blocks or peripheral functional blocks. In this semiconductor device, one of the sub functional blocks is often replaced by another, to thereby develop (design) another semiconductor device.

In a prior art semiconductor device, however, since each of the functional blocks is of a complex shape, when one sub functional block is replaced by another, a space may be created, thus reducing the integration of the semiconductor device. Conversely, in order to avoid the creation of such a space, the other sub functional block may be required to be changed into another shape, thus reducing the efficiency of design. This will be explained later in detail.

SUMMARY OF THE INVENTION

It is an object of the present invention to enhance the integration and efficiency of design of a semiconductor device including a plurality of functional blocks.

According to the present invention, in a semiconductor device having a plurality of functional blocks, the functional blocks are all rectangular, and have at least one common length along one direction. Thus, the replacement of functional blocks can be carried out without modifying the shape thereof.

BRIEF DESCRIPTION OF THE DRAWINGS

The present invention will be more clearly understood from the description as set forth below, in comparison with the prior art, with reference to the accompanying drawings, wherein.

Figure 7A:
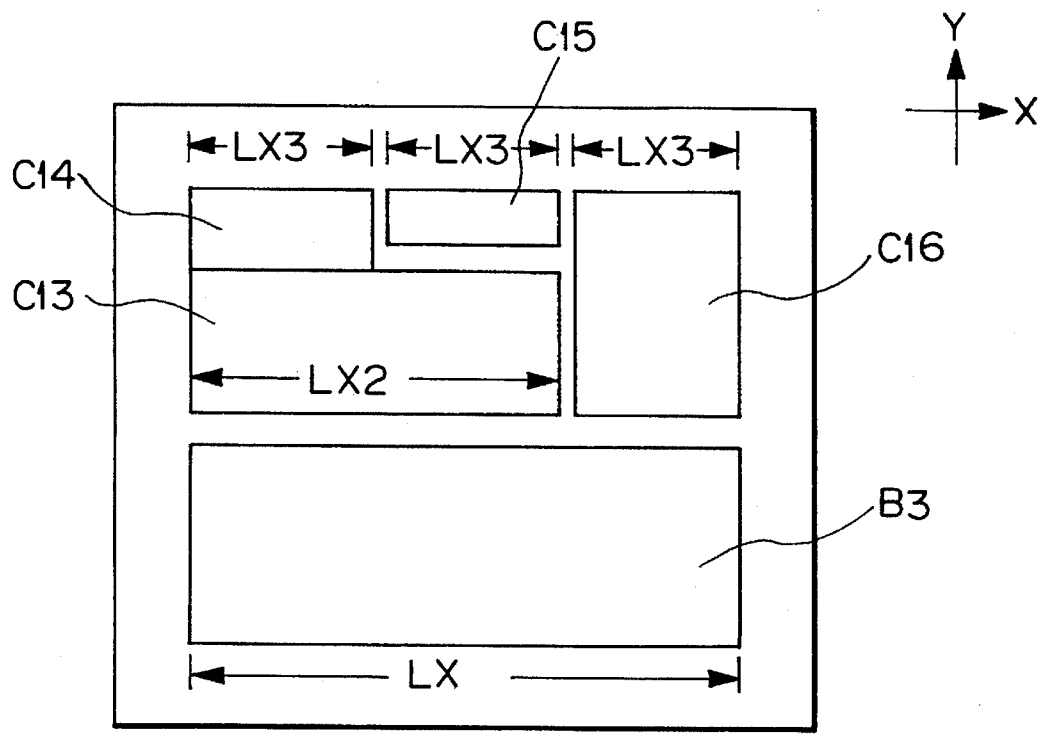
Figure 7B:
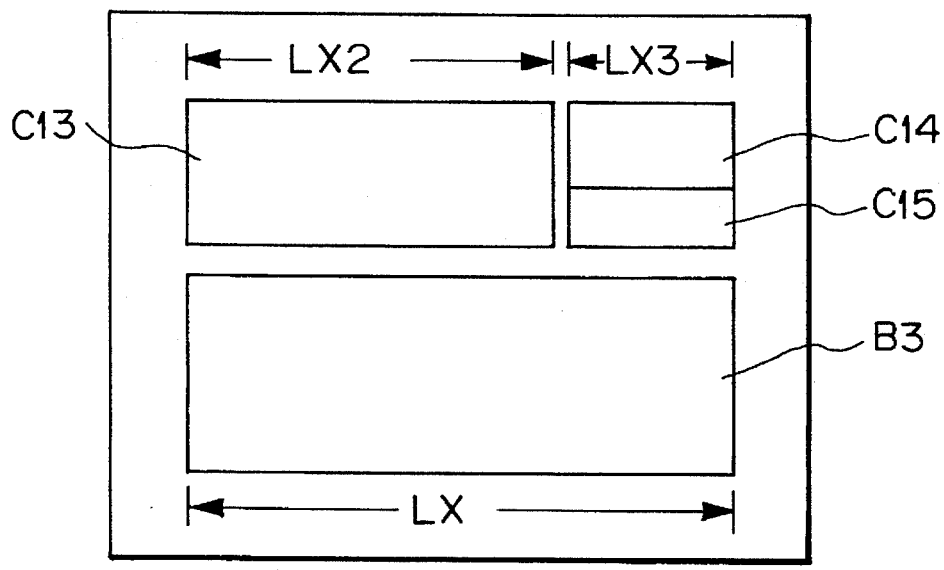
Figure 8A:
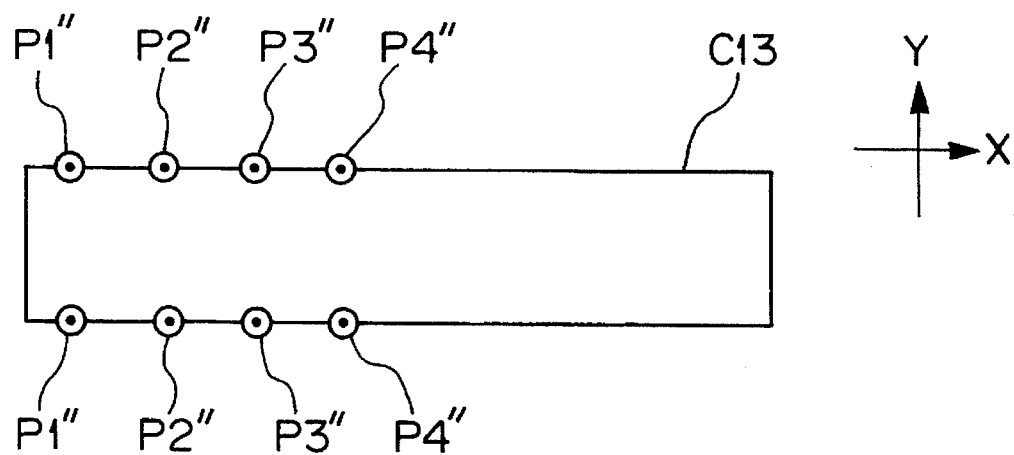
Figure 8B:
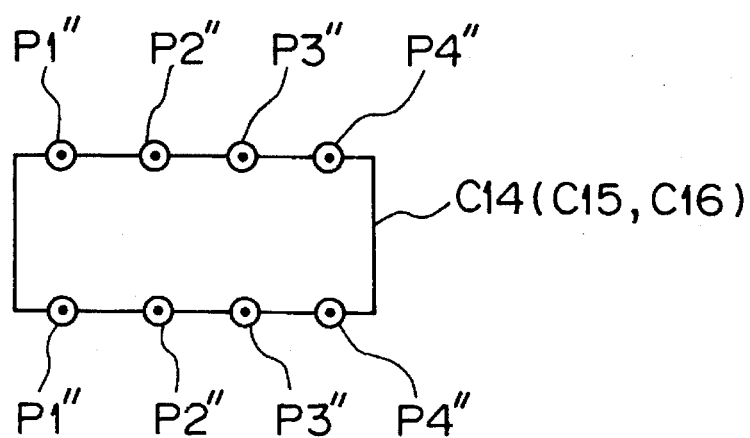
Figure 9A:
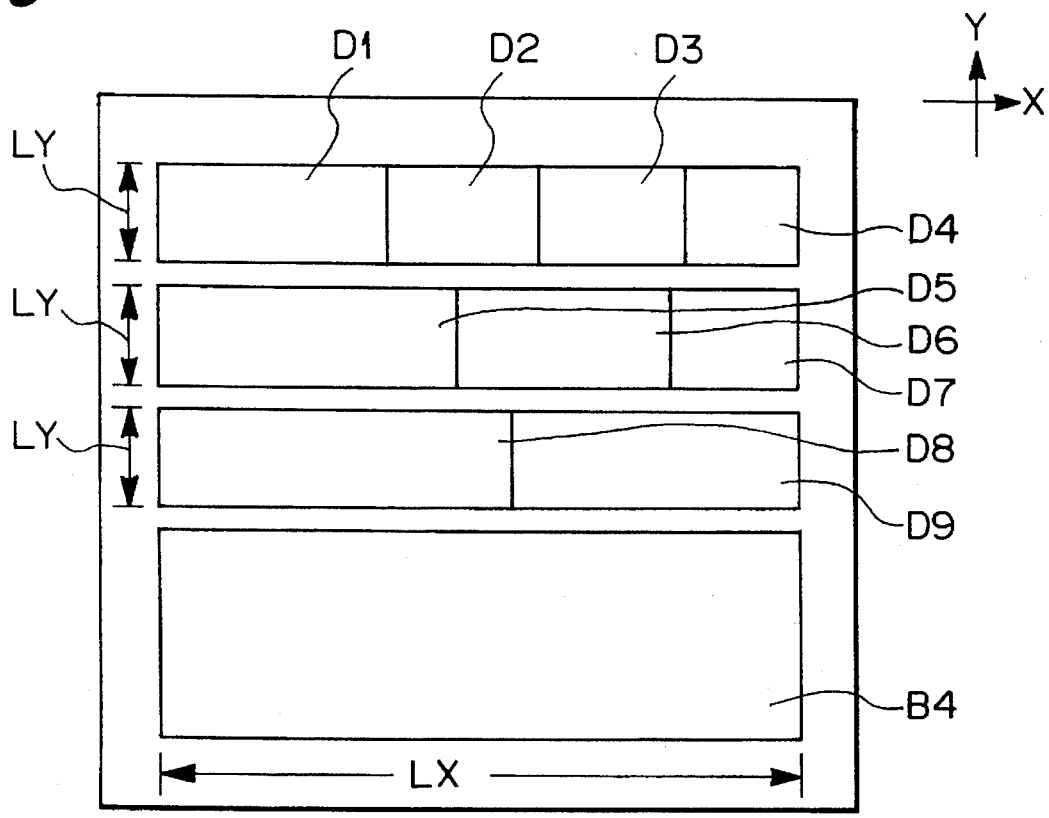
Figure 9B:
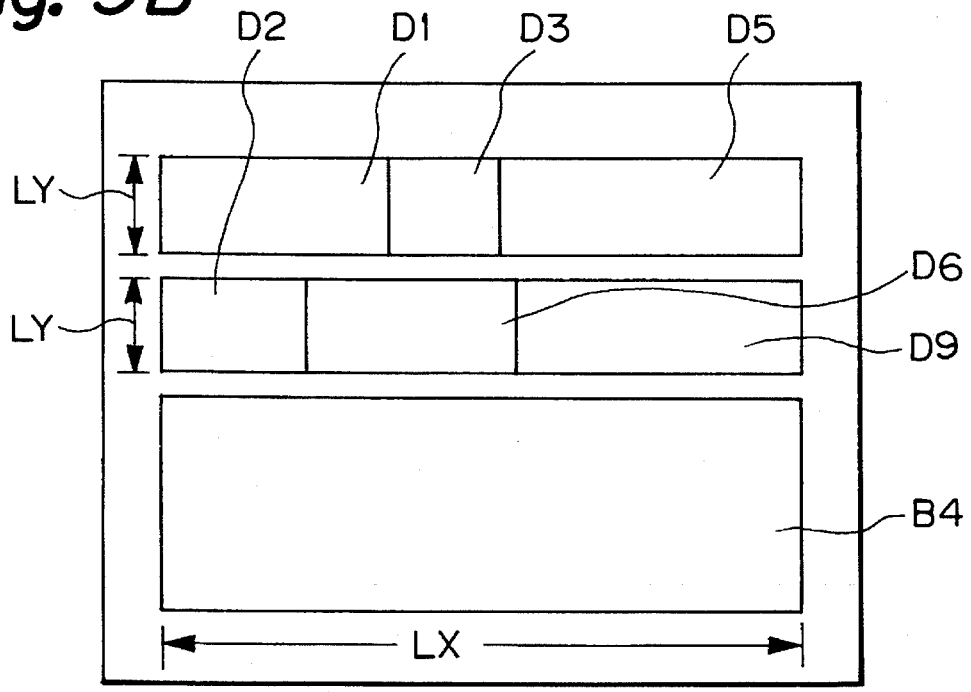
Figure 10:
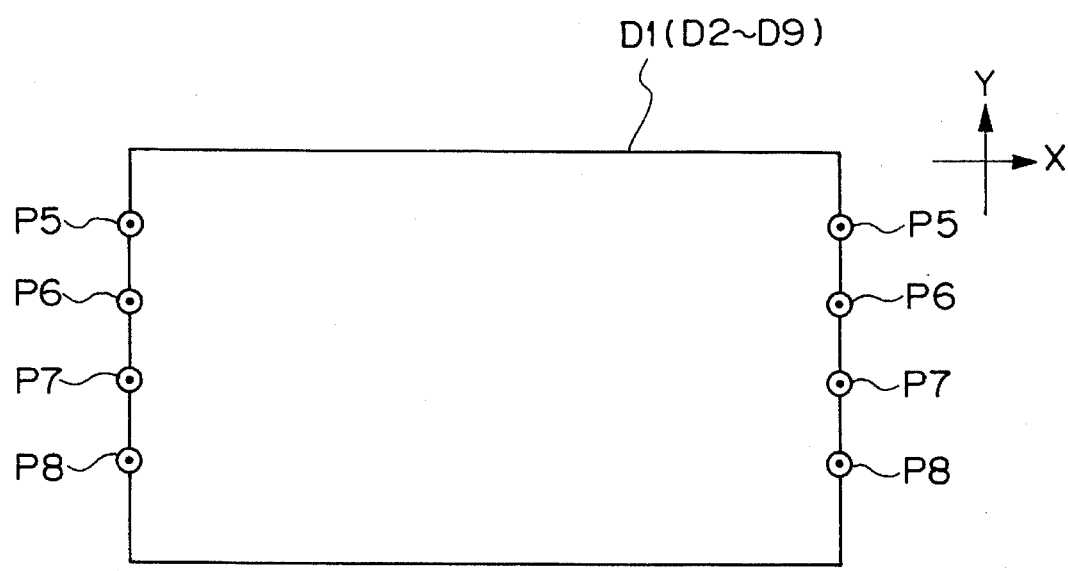
Figure 11:
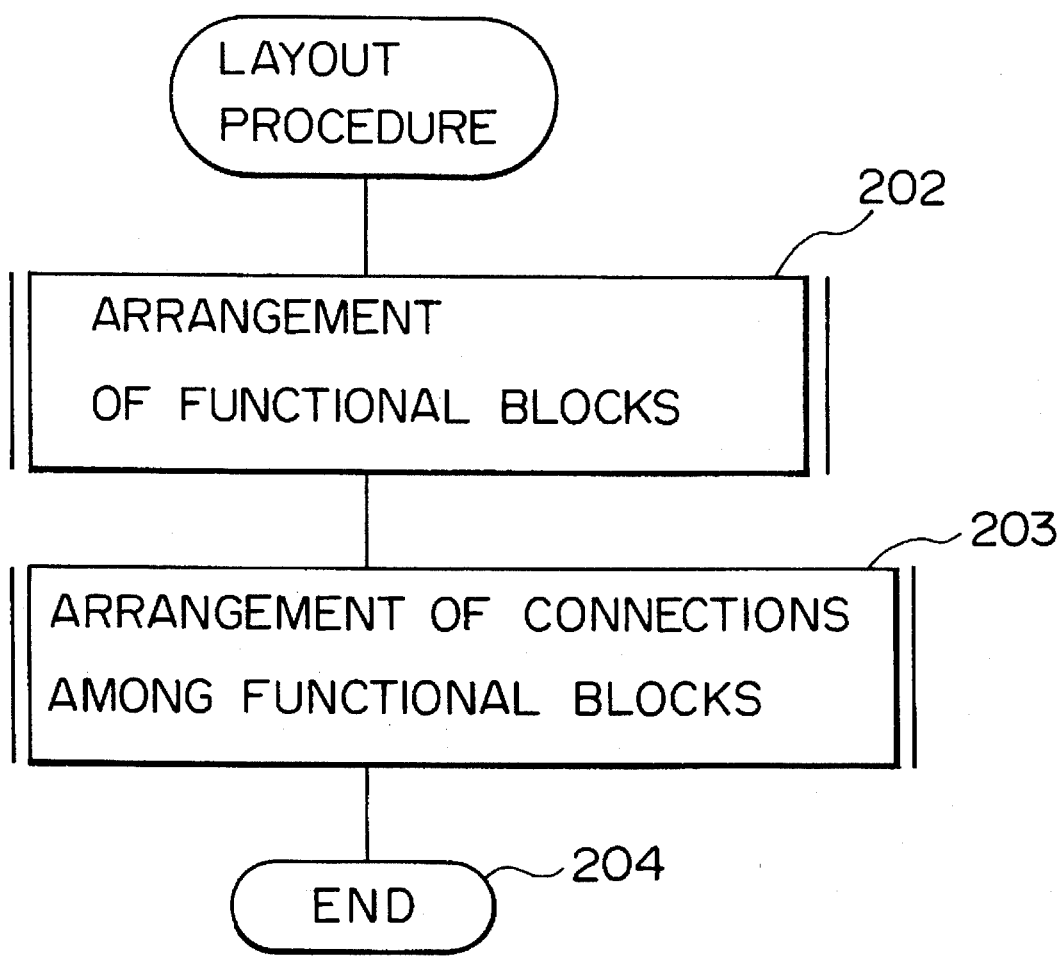

FIGS, 7A and 7B are layout diagrams illustrating a third embodiment of the semiconductor device according to the present invention;

FIGS. 8A and 8B are layout diagrams of enlargements of the functional blocks of FIGS. 7A and 7B;

FIGS. 9A and 9B are layout diagrams illustrating a fourth embodiment of the semiconductor device according to the present invention;

FIG. 10 is a layout diagram of an enlargement of one functional block of FIGS. 9A and 9B; and FIG. 11 is a flowchart showing a layout procedure for the semiconductor device of FIGS. 3A, 3B, 5A, 5B, 7A, 7B, 9A, and 9B.

DESCRIPTION OF THE PREFERRED EMBODIMENTS

Before, the description of the preferred embodiments, prior art semiconductor devices will be explained with reference to FIGS. 1A, 1B, and 1C.

Figure 1A:
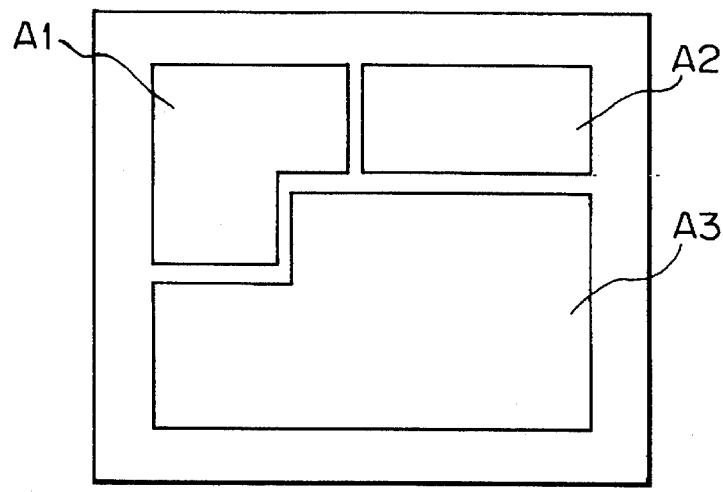
FIGS. 1A, 1B and 1C are layout diagrams illustrating prior art semiconductor devices.

As illustrated in FIG. 1A, functional blocks A1, A2 and A3 are of a complex shape, so as to create no wasted space. That is, each of the functional blocks A1, A2 and A3 is modified and has an optimum shape.

Figure 1B:
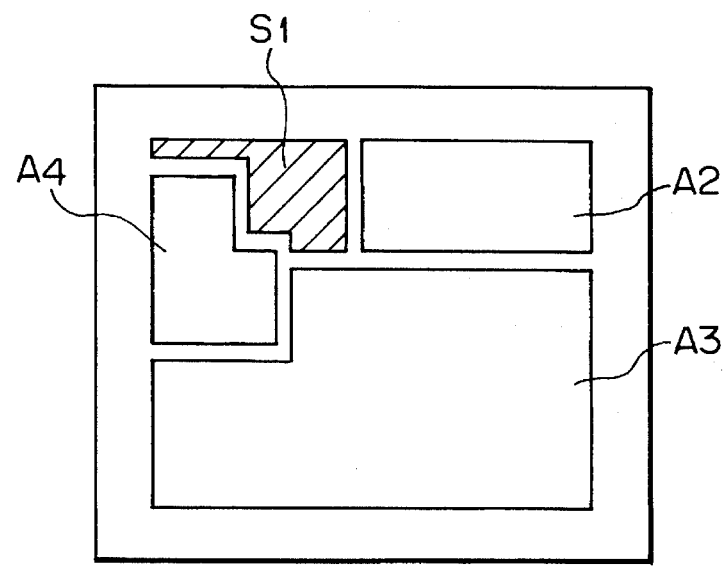

When simply replacing the functional block A1 of FIG. 1A with a functional block A4, a semiconductor device as illustrated FIG. 1B is obtained, so that a space indicated by S1 is created, thus reducing the integration.

Figure 1C:
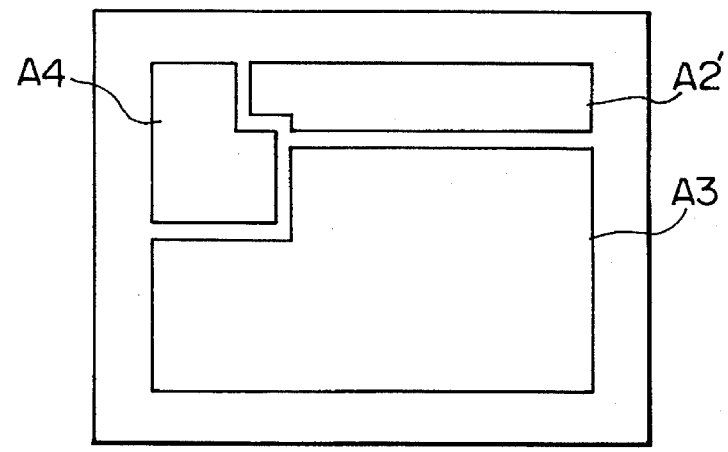

In order to avoid the creation of the space S1 of FIG. 1B, the functional block A2 is modified to a functional block A2' as illustrated in FIG. 1C.

Figure 2:
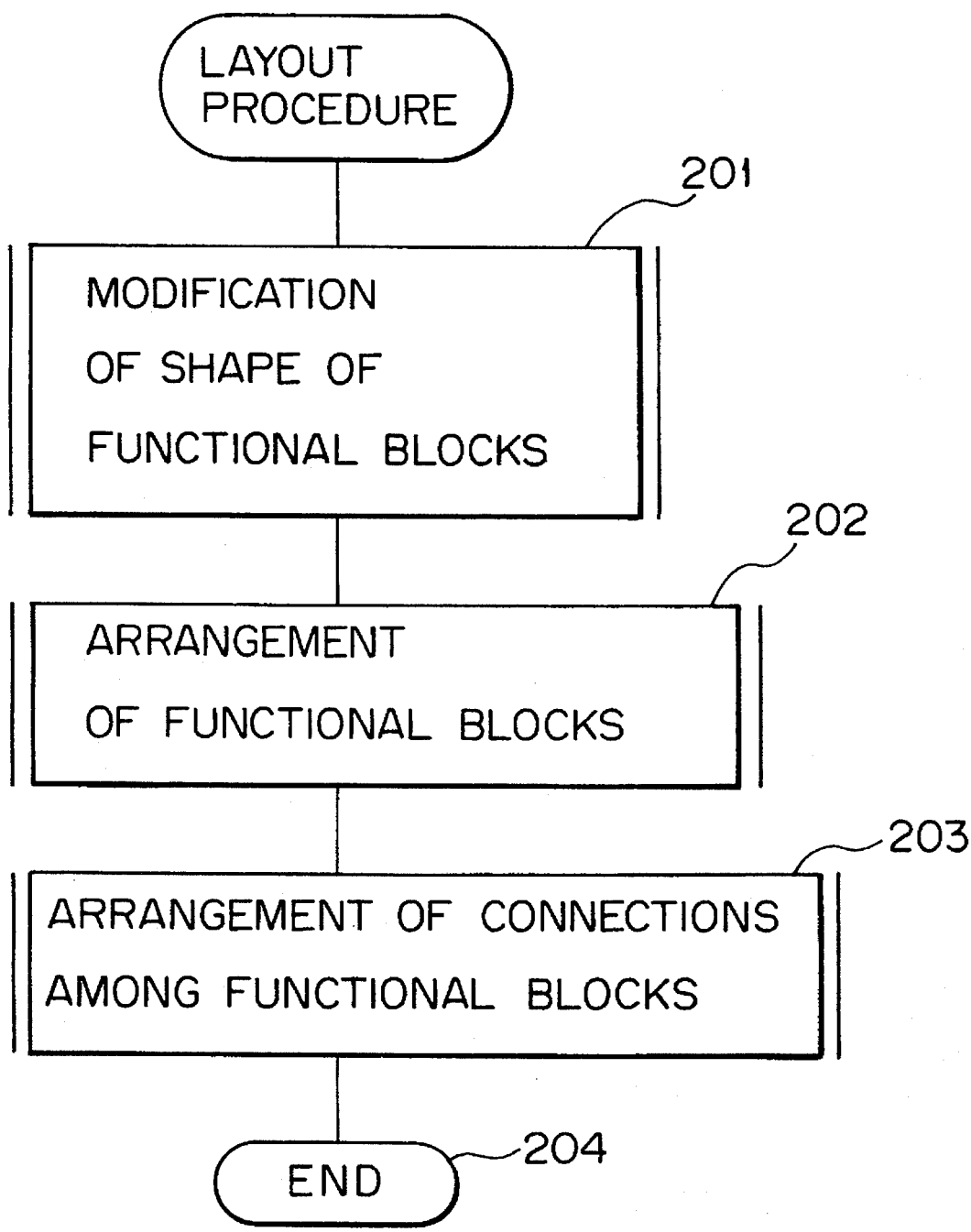
FIG. 2 is a flowchart showing a layout procedure for the semiconductor device of FIG. 1C.

A method for making a layout for the prior art semiconductor device of FIG. 1C is generally depicted by a flowchart as shown in FIG. 2. That is, at step 201, one or more functional blocks are modified have their optimum shapes. Then, at step 202, the functional blocks are arranged within a chip, and at step 203, connections or wiring are arranged among the functional blocks. Thus, a layout of a semiconductor device is completed by step 204. Thus, due to the presence of the shape modifying step 201, the efficiency of a layout design is reduced.

Figure 3A:
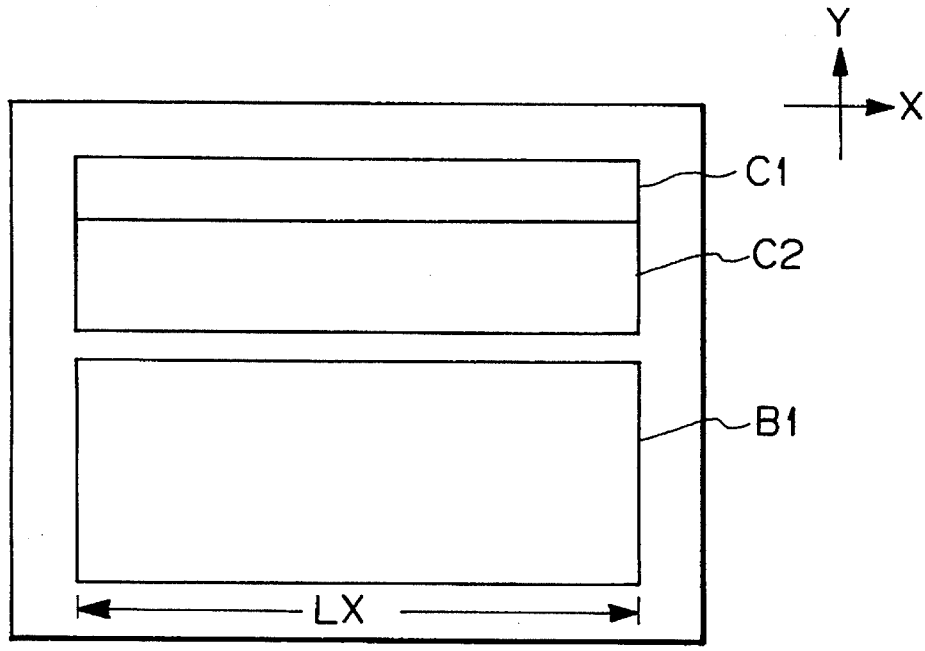
FIGS. 3A and 3B are layout diagrams illustrating a first embodiment of the semiconductor device according to the present invention.
Figure 3B:
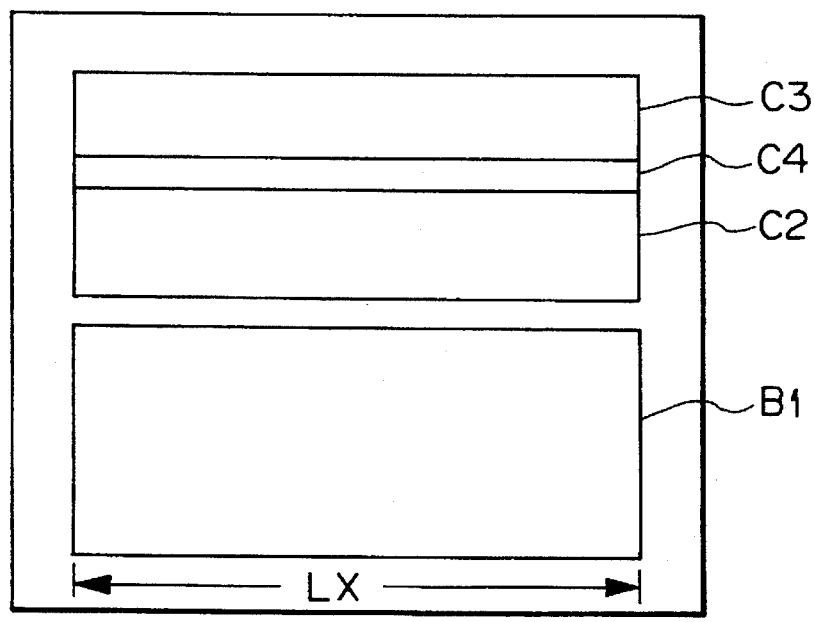

In FIGS. 3A and 3B, which illustrate a first embodiment of the present invention, reference B1 designates a main functional block including a CPU core and the like, and references C1, C2, C3 and C4 designate sub functional blocks or peripheral functional blocks including a random access memory (RAM), a read-only memory (ROM), and the like. All of the functional blocks are rectangular. Also, the length of all of the functional blocks along the X direction is LX, while the lengths of the functional blocks B1, C1, C2, C3 and C4 along the Y direction are different from each other.

Figure 4:
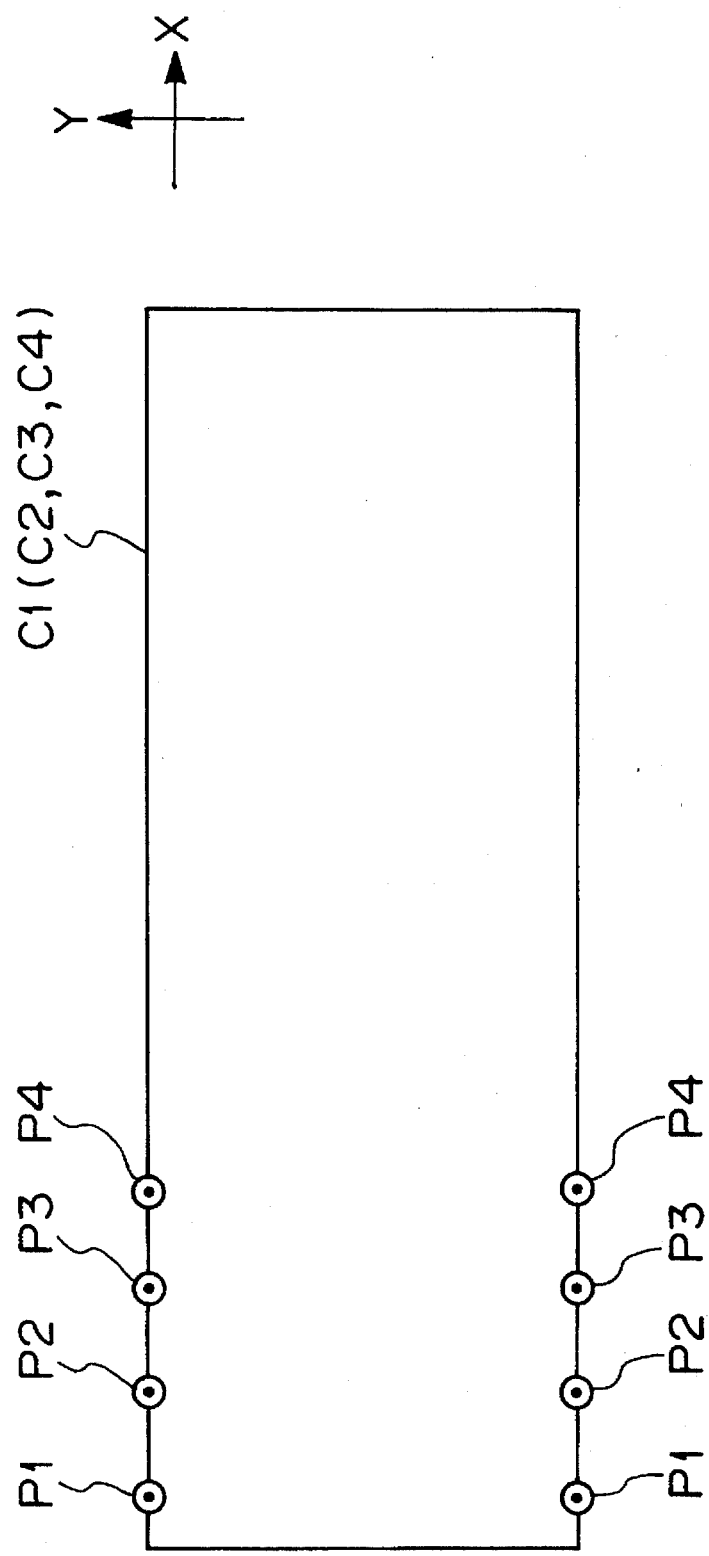
FIG. 4 is a layout diagram of an enlargement of one functional block of FIGS. 3A and 3B.

Also, as illustrated in FIG. 4, the sub connected directly to the sub functional block C6 by the batting method, so that no space is created therebetween. On the other hand, the sub functional blocks C7, C8 and C9 coincide with the right side of the main functional block B2 along the X direction. Also, since the sub functional blocks C7, C8 and C9 have the same input/output terminals, the sub functional block C7, C8 and C9 are connected directly to each other by the batting method, so that no space is created therebetween.

Figure 5A:
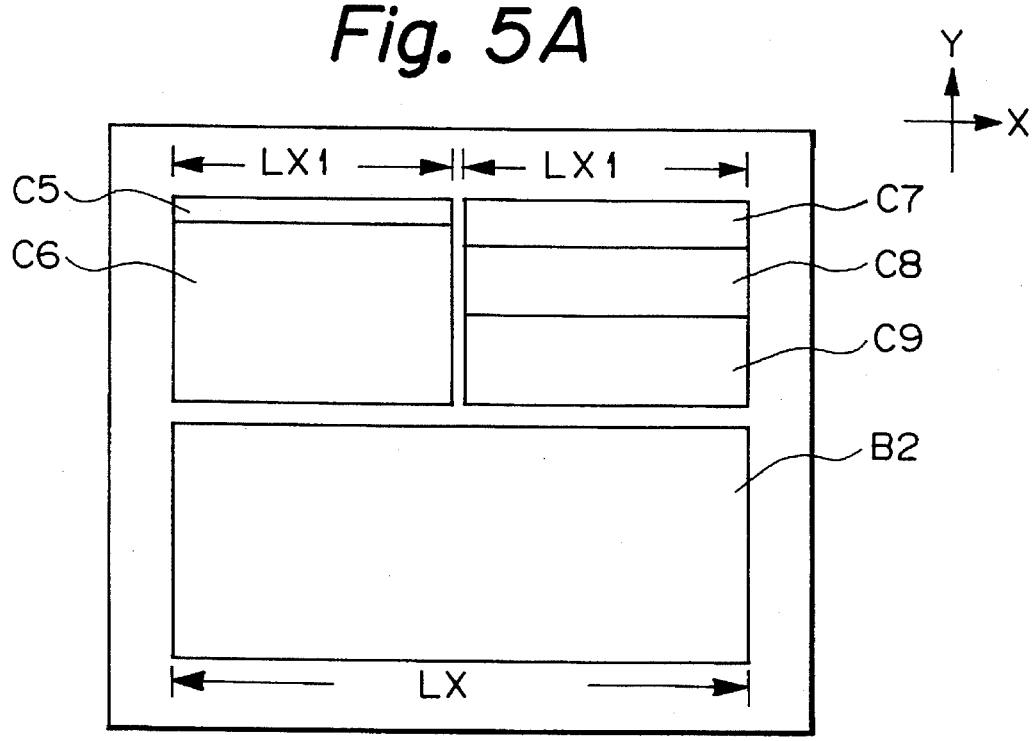
FIGS. 5A and 5B are layout diagrams illustrating a second embodiment of the semiconductor device according to the present invention.
Figure 5B:
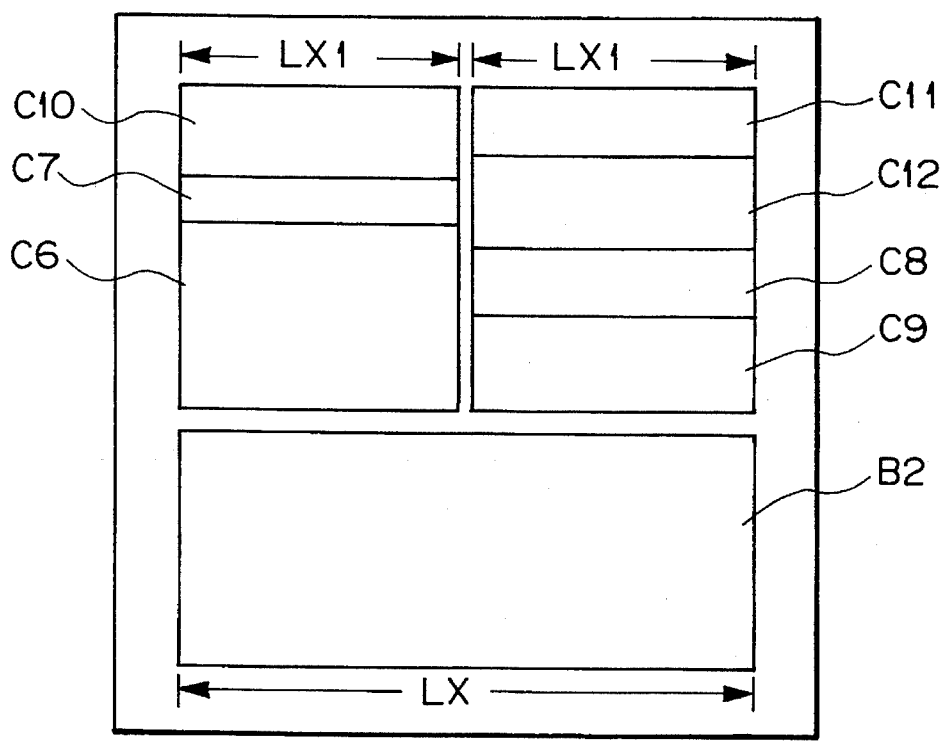

When replacing the sub functional block C5 of FIG. 5A with the functional blocks C10, C11 and C12, the semiconductor device as illustrated in FIG. 5B is obtained. In this case, the sub functional block C7 is moved from the right column to the left column. Then, the additional sub functional block C10 is arranged in the left column, and the additional sub functional blocks C11 and C12 are arranged in the right column, to thereby balance the right column and the left column with each other, thus avoiding the creation of a space. Also, since the sub functional blocks C10, C7 and C6 have the same length LX1 along the X direction and the same input/output terminals P1', P2', P3' and P4', the sub functional blocks C10, C7 and C6 are easily connected directly to each other by the batting method, so that no space is created therebetween. Further, since the sub functional blocks C11, C12, C8 and C9 have the same length LX1 along the X direction and the same input/output terminals P1', P2', P3' and P4', the sub functional blocks C11, C12, C8 and C9 are easily connected directly to each other by the batting method, so that no space is created therebetween.

In FIGS. 7A and 7B, which illustrate a third embodiment of the present invention, reference B3 designates a main functional block, and references C13 through C16 designate sub functional blocks. All of the functional blocks are rectangular. Also, the length of the main functional block along the X direction is LX, the length of the sub functional block C13 along the X direction is LX2 ($\approx$2LX/3), and the length of the sub functional blocks C14, c15 and C16 along the X direction is LX3 ($\approx$LX/3). On the other hand, the lengths of the functional blocks along the Y direction are different from each other. And, the sub functional blocks are arranged in two or three columns.

Also, as illustrated in FIGS. 8A and 8B, the sub functional blocks C13 and C14 (C15, C16) have input/output terminals P1", P2", P3" and P4" on edges along the X direction.

Therefore, in FIG. 7A, the sub functional block C13 coincides with the left side and top side of the main functional block B3 along the X direction, and the sub functional blocks C14, C15 and C16 coincide with the left side, top side and right side, respectively, of the main functional block B3. Also, since the sub functional blocks C13 and C14 have the same input/output terminals, the sub functional block C13 is connected directly to the sub functional block C14 by the batting method, so that no space is created therebetween.

When removing the sub functional block C16 of FIG. 7A, the semiconductor device as illustrated in FIG. 7B is obtained. In this case, the sub functional blocks C14 and C15 are moved to the right column, to thereby balance the right column, the middle column and the left column with each other, thus avoiding the creation of a space. Also, since the sub functional blocks C14 and C15 have the same length LX3 along the X direction and the same input/output terminals P1", P2", P3" and P4", the sub functional blocks C14 and C15 are easily connected directly to each other by the batting method, so that no space is created therebetween.

In the second and third embodiments illustrated in FIGS. 5A, 5B, 7A and 7B, when the sub functional blocks are smaller than the main functional block, the sub functional blocks are arranged in two or three columns. However, in the present invention, the sub functional functional block C1 (C2, C3, C4) has input/output virtual terminals (locations) P1, P2, P3 and P4, which are simply referred to as terminals, on edges along the X direction.

Therefore, in FIG. 3A, the sub functional blocks C1 and C2 coincide with the main functional block B1 along the X direction. Also, since the sub functional blocks C1 and C2 have the same input/output terminals, the sub functional block C1 is connected directly to the sub functional block C2 by the batting method.

When replacing the sub functional block C1 of FIG. 3A with the functional blocks C3 and C4, the semiconductor device as illustrated in FIG. 3B is obtained. In this case, the sub functional blocks C3 and C4 have the same length LX along the X direction and the same input/output terminals P1, P2, P3 and P4, the sub functional blocks C2, C3 and C4 are easily connected directly to each other by the batting method, so that no space is created therebetween.

In FIGS. 5A and 5B, which illustrate a second embodiment of the present invention, reference B2 designates a main functional block, and references C5 through C11 designate sub functional blocks. All of the functional blocks are rectangular. Also, the length of the main functional block B2 along the X direction is LX, and the length of the sub functional blocks C5 through C12 along the X direction is LX1 ($\approx$LX/2). On the other hand, the lengths of the functional blocks along the Y direction are different from each other. And, the sub functional blocks are arranged in two columns.

Figure 6:
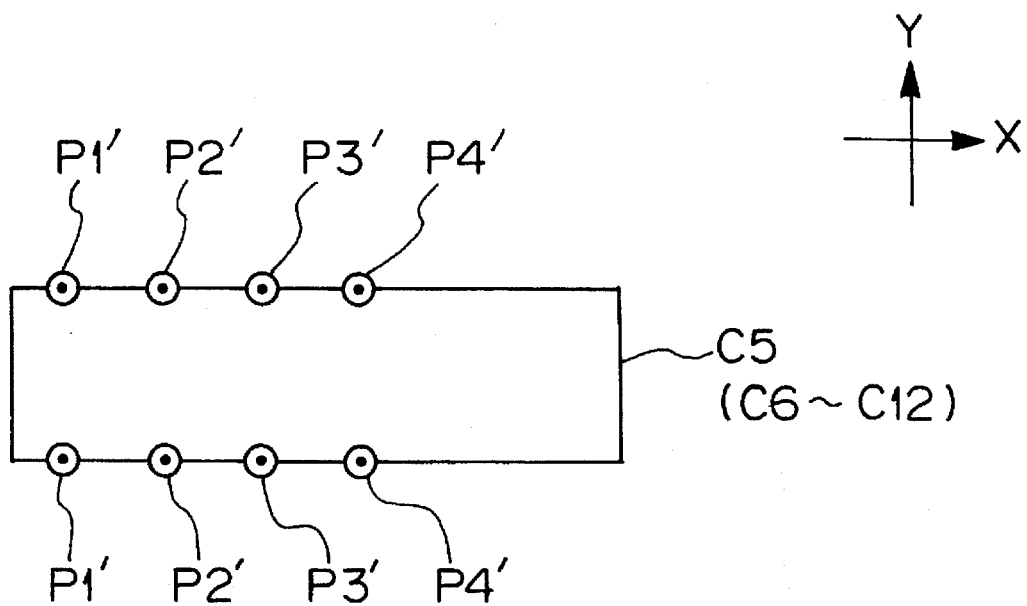
FIG. 6 is a layout diagram of an enlargement of one functional block of FIGS., 5A and 5B.

Also, as illustrated in FIG. 6, the sub functional block C5 (C6~C12) has input/output terminals P1', P2', P3' and P4' on edges along the X direction.

Therefore, in FIG. 5A, the sub functional blocks C5 and C6 coincide with the left side of the main functional block B2 along the X direction. Also, since the sub functional blocks C5 and C6 have the same input/output terminals, the sub functional block C5 is blocks can be arranged in four or more columns. Generally, if the length of a sub functional block along the X direction is represented by LXi, the following equation is satisfied:

$$LXi = n/m \cdot LX$$

where $m \geq n$, m and n are positive integers.

In FIGS. 9A and 9B, which illustrate a fourth embodiment of the present invention, reference B3 designates a main functional block, and references D1 through D9 designate sub functional blocks. All of the functional blocks are rectangular. Also, the length of the main functional block B3 along the X direction is LX, and the length of the sub functional blocks D1 through D9 along the Y direction is LY. On the other hand, the lengths of the sub functional blocks along the X direction are different from each other. Thus, the sub functional blocks are arranged in two or three rows.

Also, as illustrated in FIG. 10, the sub functional block D1 (D2~D9) has input/output terminals P5, P6, P7 and P8 on edges along the Y direction.

Therefore, in FIG. 9A, the sub functional blocks D1, D2, D3 and D4 are arranged in a row. Also, since the sub functional blocks D1, D2, D3 and D4 have the same terminals P5, P6, P7 and P8, the sub functional blocks D1, D2, D3 and D4 are connected directly to each other by the batting method, so that no space is created therebetween. The sub functional blocks D5, D6, D7 and D8 are arranged in a row. Also, since the sub functional blocks D5, D6, D7 and D8 have the same terminals P5, P6, P7 and P8, the sub functional blocks D5, D6, D7 and D8 are connected directly to each other by the batting method, so that no space is created therebetween. The sub functional blocks D8 and D9 are arranged in a row. Also, since the sub functional blocks D8 and D9 have the same terminals P5, P6, P7 and P8, the sub functional blocks D8 and D9 are connected directly to each other by the batting method, so that no space is created therebetween.

When removing the sub functional blocks D4, D7 and D8 of FIG. 9A, the semiconductor device as illustrated in FIG. 9B is obtained. In this case, the sub functional blocks D1, D3 and D5 are arranged in a row. Also, since the sub functional blocks D1, D3 and D5 have the same terminals P5, P6, P7 and PS, the sub functional blocks D5, D6, D7 and D8 are connected directly to each other by the batting method, so that no space is created therebetween. Futher, the sub functional blocks D2, D6 and D9 are arranged in a row. Also, since the sub functional blocks D8 and D9 have the same terminals P5, P6, P7 and P8, the sub functional blocks D2, D6 and D9 are connected directly to each other by the batting method, so that no space is created therebetween.

In FIGS. 9A and 9B, the length of each row of the sub functional blocks along the X direction is approximately LX. That is, the rows of the sub functional blocks are balanced, thus avoiding the creation of a space.

In the fourth embodiment illustrated in FIGS. 9A and 9B, when the sub functional blocks are smaller than the main functional block, the sub function blocks are arranged in two or three rows. However, in the present invention, the sub functional blocks can be arranged in four or more columns.

A method for making a layout for a semiconductor device according to the present invention is generally depicted by a flowchart as shown in FIG. 11. That is, at step 202, the functional blocks are arranged within a chip, and at step 203, connections or wiring are arranged among the functional blocks. Thus, the layout of a semiconductor device is completed by step 204. Thus, due to the absence of the shape modifying step 201 of FIG. 2, the efficiency of a layout design is increased.

As explained hereinbefore, according to the present invention, since functional blocks are rectangular, the integration and efficiency of design can be improved.

I claim:

1. A semiconductor device comprising:

a plurality of functional blocks formed on a chip, said functional blocks being rectangular and having at least one length along one direction, wherein at least two of said functional blocks each have at least one same edge along said one direction, said same edge having said one length and a plurality of input/output terminals, wherein said input/output terminals are at similar locations along each said same edge, one of said functional blocks being fixed within said device and the others of said functional blocks being variable within said device, wherein a ratio of the length of one of said functional blocks to that of another thereof along the same one direction is approximately m/n, where m and n are positive integers and m is less than n, said semiconductor device further comprising:
a main functional block of said plurality of functional blocks: and
a plurality of sub functional blocks, of said plurality of functional blocks, operatively connected to each other, at least one of said sub functional blocks being operatively connected to said main functional block, wherein said sub functional blocks are operatively connected to each other such that adjacent sub functional blocks of said plurality of sub functional blocks are closely connected, connections between blocks being performed by a batting method.

2. A semiconductor device comprising:

a rectangular main functional block having a first length along a first direction; and a plurality of rectangular sub functional blocks, each having a second length along the first direction, the second length being approximately n/m of the first length, wherein n is less than m, and m and n are positive integers, each of said sub functional blocks having at least one edge parallel to said first direction; and each of said sub functional sub blocks having a plurality of input/output terminals at similar predetermined positions on said edge, said rectangular main functional block being fixed within said device, and said rectangular sub functional blocks being variable within said device, wherein a ratio of the length of one of said functional blocks to that of another thereof along the same one direction is approximately m/n where m and n are positive integers and m is less than n, said plurality of sub functional blocks operatively connected to each other, at least one of said sub functional blocks being operatively connected to said main functional block, wherein said sub functional blocks are operatively connected to each other such that adjacent sub functional blocks of said plurality of sub functional blocks are closely connected, connections between blocks being performed by a batting method.

3. A device as set forth in claim 2, wherein said rectangular sub functional blocks are arranged in one or more columns along a second direction perpendicular to the first direction.

4. A device as set forth in claim 2, wherein said rectangular sub functional blocks are connected directly to each other to form one or more columns along a second direction perpendicular to the first direction.

5. A semiconductor device comprising:

a plurality of functional blocks formed on a chip, said functional blocks being rectangular and having at least one length along one direction, wherein a ratio of said one length of one functional block of said functional blocks to that of another functional block of said functional blocks along said one direction is substantially m/n where m and n are different positive integers, one of said functional blocks being fixed within said device and the others of said functional blocks being variable within said device, wherein a ratio of the length of one of said functional blocks to that of another thereof along the same one direction is approximately m/n where m and n are positive integers and m is less than n, said semiconductor device further comprising:
a main functional block of said plurality of functional blocks; and
a plurality of sub functional blocks, of said plurality of functional blocks, operatively connected to each other, at least one of said sub functional blocks being operatively connected to said main functional block, wherein said sub functional blocks are operatively connected to each other such that adjacent sub functional blocks of said plurality of sub functional blocks are closely connected, connections between blocks being performed by a batting method.

6. A semiconductor device comprising:

a rectangular main functional block having a first length along a first direction; and a plurality of rectangular sub functional blocks, each having a second length along the first direction, the second length being substantially equal to the ratio m/n of the first length, wherein m is greater than n, m is a positive integer above 1 and n is a positive integer, said rectangular main functional block being fixed within said device, and said rectangular sub functional blocks being variable within said device, wherein a ratio of the length of one of said functional blocks to that of another thereof along the same one direction is approximately m/n where m and n are positive integers and m is less than n, said plurality of sub functional blocks, of said plurality of functional blocks, operatively connected to each other, at least one of said sub functional blocks being operatively connected to said main functional block, wherein said sub functional blocks are operatively connected to each other such that adjacent sub functional blocks of said plurality of sub functional blocks are closely connected, connections between blocks being performed by a batting method.

7. A semiconductor device as in claim 1, further comprising a plurality of replacement functional blocks having said one length, said replacement functional blocks for replacing said functional blocks.

8. A semiconductor device as in claim 2, further comprising a plurality of replacement functional blocks having said first length, said replacement functional blocks for replacing said functional blocks.

9. A semiconductor device as in claim 1, wherein said main functional block has a first width in a second direction perpendicular to said one direction and said plurality of sub functional blocks each have a second width in said second direction, wherein said first width is different than said second width.

10. A semiconductor device as in claim 1, further comprising:

a plurality of first functional blocks, of said plurality of sub functional blocks, operatively connected to each other, at least one of said first functional blocks being operatively connected to said main functional block; and a plurality of second functional blocks, of said plurality of sub functional blocks, operatively connected to each other, one of said second functional blocks being operatively connected to said main functional block, said first functional blocks having a first length in said one direction and said second functional blocks having a second length in said one direction, wherein a sum of said first length and said second length is equal to said one length.

11. A semiconductor as in claim 10, wherein said first functional blocks comprise a first column and said second functional blocks comprise a second column, said first column and said second column each having a substantially similar height in said second direction.

12. A semiconductor as in claim 1, further comprising a plurality of replacement functional blocks having said one length, said replacement functional blocks for replacing said sub functional blocks.

* * * * *